United States Patent
Kunikiyo et al.

(10) Patent No.: US 9,159,911 B2
(45) Date of Patent: Oct. 13, 2015

(54) MEMORY ELEMENT AND MEMORY DEVICE

(75) Inventors: Toshiyuki Kunikiyo, Kanagawa (JP); Shinnosuke Hattori, Tokyo (JP); Mitsunori Nakamoto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 311 days.

(21) Appl. No.: 13/223,391

(22) Filed: Sep. 1, 2011

(65) Prior Publication Data

US 2012/0061638 A1 Mar. 15, 2012

(30) Foreign Application Priority Data

Sep. 10, 2010 (JP) ................................. 2010-203475

(51) Int. Cl.
*H01L 45/00* (2006.01)
*H01L 27/24* (2006.01)
*G11C 13/00* (2006.01)

(52) U.S. Cl.
CPC ............ *H01L 45/08* (2013.01); *H01L 27/2463* (2013.01); *H01L 45/085* (2013.01); *G11C 13/0011* (2013.01)

(58) Field of Classification Search
CPC ........ H01L 45/085; H01L 45/08; H01L 45/04
USPC ........................ 257/3, 4, 5, E47.001, E21.622
See application file for complete search history.

(56) References Cited

U.S. PATENT DOCUMENTS

| | | | | |
|---|---|---|---|---|
| 7,345,908 B2* | 3/2008 | Hachino et al. | | 365/148 |
| 2006/0126423 A1* | 6/2006 | Aratani et al. | | 365/232 |
| 2009/0323397 A1* | 12/2009 | Kinoshita | | 365/148 |
| 2010/0176365 A1* | 7/2010 | Park et al. | | 257/3 |

FOREIGN PATENT DOCUMENTS

| | | |
|---|---|---|
| JP | 2005-197634 | 7/2005 |
| JP | 2009-164467 | 7/2009 |

OTHER PUBLICATIONS

Hiroyoshi Momida et al.; Effect of vacancy-type oxygen deficiency on electronic structure in amorphous alumina; Applied Physics Letters; 98; 042102; 2011.

* cited by examiner

Primary Examiner — Yu-Hsi D Sun
(74) Attorney, Agent, or Firm — Dentons US LLP (57) ABSTRACT

There are provided a memory element and a memory device in which the state of erasing remains stable by deactivation of a localized site(s) formed inside of a resistance change layer. The memory element includes a first electrode, a memory layer, and a second electrode in this order. The memory layer includes a resistance change layer including an n-type dopant or a p-type dopant, and disposed on the first electrode side, and an ion source layer disposed between the resistance change layer and the second electrode.

16 Claims, 5 Drawing Sheets

MEMORY ELEMENT AND MEMORY DEVICE

BACKGROUND

The present disclosure relates to a memory element storing information, based on any change of electrical characteristics observed in a memory layer including an ion source layer and a resistance change layer, and to a memory device.

A semiconductor nonvolatile memory popularly used for data storage has been a NOR or NAND flash memory. Such a semiconductor nonvolatile memory, however, has been pointed out that there are limitations on microfabrication considering the need for a high level of voltage for writing and erasing, and the limited number of electrons for injection to a floating gate.

For overcoming such limitations on microfabrication, a next-generation nonvolatile memory currently proposed is a resistance change memory such as ReRAM (Resistance Random Access Memory) or PRAM (Phase-Change Random Access Memory) (for example, see Japanese Unexamined Patent Application Publication Nos. 2005-197634 and 2009-164467. These memories (memory elements) are each configured to include a memory layer between upper and lower electrodes. The memory layer includes a resistance change layer and an ion source layer. Through application of an electric field to the memory layer by voltage application to the upper and lower electrodes, mobile atoms move in a direction corresponding to the direction of the electric field. The migration of the mobile atoms as such causes a change of resistance between the electrodes so that writing and erasing of data are performed. To be specific, during writing of data, a large number of mobile atoms are introduced from the ion source layer into the resistance change layer, thereby reducing the resistance of the resistance change layer. During erasing of data, by application of a voltage inverse to that applied during writing of data, the mobile atoms introduced into the resistance change layer are moved to the ion source layer side. In the resulting resistance change layer, the electrical conduction path is completely erased so that the resistance change layer is restored to the state before writing of data.

SUMMARY

The issue here is that, in actuality, applying an erasing voltage is hardly a solution for restoring the resistance of the resistance change layer to the value (initial state) before application of the voltage. This is because, although most of the mobile atoms in the resistance change layer are moved to the ion source layer side by application of the erasing voltage, the mobile atoms partially remain inside of the resistance change layer, or the movement of the mobile atoms results in the locally-nonuniform structure like atomic vacancy, i.e., results in the formation of a localized site(s) (for example, see Non-Patent Literature 1 (Momida, Ohno, Nigo, et al., Proceedings of 56-th Conference on Applied Physical Chemistry, Spring 2009)). When the resistance value becomes unstable in the state of erasing, a resistance value difference is reduced between the state of writing (low-resistance state) and the state of erasing (high-resistance state), thereby causing a disadvantage of impairing the function of the resulting memory device.

It is thus desirable to provide a memory element and a memory device in which the state of erasing remains stable by deactivation of a localized site(s) formed inside of a resistance change layer.

A memory element according to an embodiment of the present disclosure includes a first electrode, a memory layer, and a second electrode in this order. The memory layer includes a resistance change layer, and an ion source layer. The resistance change layer is disposed on the first electrode side, and includes an n-type dopant or a p-type dopant. The ion source layer is disposed on the second electrode side.

A memory device according to an embodiment of the present disclosure includes a plurality of memory elements each including a first electrode, a memory layer, and a second electrode in this order, and a pulse application section applying a voltage or current pulse selectively to the memory elements. In the memory device, the memory elements are those according to the embodiment of the present disclosure.

In the memory element (memory device) according to the embodiment of the present disclosure, when a voltage or current pulse of "positive direction" (e.g., the first electrode side is at a negative potential, and the second electrode side is at a positive potential) with respect to the element in the initial state (high-resistance state), any metallic element contained in the ion source layer is ionized and diffused in the resistance change layer, and then is deposited by bonding with electrons at the first electrode, or remains in the resistance change layer and forms an impurity level. As a result, a low-resistance section (conductive path) containing the metallic element is formed in the memory layer, thereby decreasing the resistance of the resistance change layer (state of writing). When a voltage pulse of "negative direction" (e.g., the first electrode side is at a positive potential, and the second electrode side is at a negative potential) is applied with respect to the element in the low-resistance state as such, the metallic element that has been deposited on the first electrode is ionized, and then is dissolved into the ion source layer. As a result, the conductive path made of the metallic element disappears, and the resistance change layer is increased in resistance (initial state or state of erasing).

Herein, by an n- or p-type dopant introduced to the resistance change layer, a localized site(s) to be formed inside of the resistance change layer are deactivated, thereby retaining the state of erasing, i.e., the state of high resistance.

With the memory element or the memory device according to the embodiment of the present disclosure, an n- or p-type dopant is introduced to the resistance change layer. This deactivates the localized site(s) inside of the resistance change layer, and accordingly stabilizes the resistance value of the resistance change layer in the state of erasing. As a result, the number of manufacture-failed elements is to be decreased, and the capacity increase is accordingly achieved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENT

In the below, by referring to the accompanying drawings, an embodiment of the present disclosure is described in the following order.
(Embodiment)
 1. Memory Element
 2. Memory Device
(Embodiment)
(Memory Element)

Figure 1:
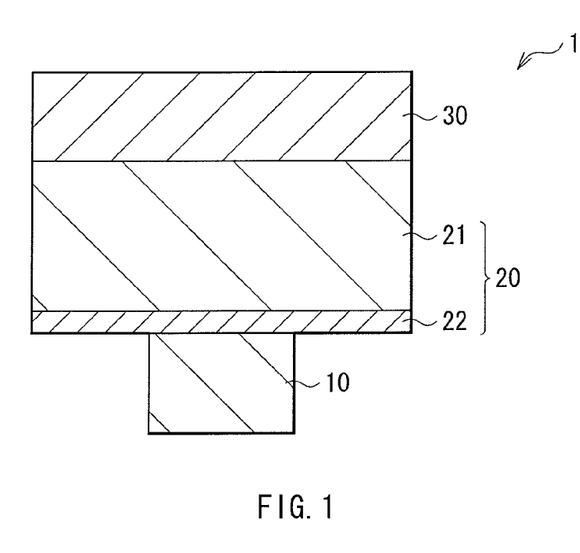
FIG. 1 is a cross-sectional view of a memory element in an embodiment of the present disclosure, showing the configuration thereof.

FIG. 1 is a cross-sectional view of a memory element 1 in an embodiment of the present disclosure, showing the configuration thereof. This memory element 1 is configured to include a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 2), for example, thereby serving as a connection section with the portion of the CMOS circuit. This lower electrode 10 is made of a material for wiring use in the semiconductor process, e.g., tungsten (W), tungsten nitride (WN), copper (Cu), aluminum (Al), molybdenum (Mo), tantalum (Ta), and silicide. When the lower electrode 10 is made of a material such as Cu that possibly causes ion conduction in an electric field, the surface of the lower electrode 10 made of Cu or others as such may be covered with a material that hardly causes ion conduction or thermal diffusion, e.g., W, WN, titanium nitride (TiN), and tantalum nitride (TaN). When an ion source layer 21 that will be described later contains Al, preferably used is a metal film containing one or more of chromium (Cr), W, cobalt (Co), silicon (Si), gold (Au), palladium (Pd), Mo, iridium (Ir), titanium (Ti), and others that are more resistant to ionization than Al, or an oxide or nitride film thereof.

The memory layer 20 is configured by the ion source layer 21, and a resistance change layer 22. The ion source layer 21 contains an element to be converted into mobile ions (cations and anions) that diffuse to the resistance change layer 22. The element that is possibly cationized includes one or two or more of metallic elements such as Cu, Al, silver (Ag), zinc (Zn), and germanium (Ge). As an ion conductive material that is to be anionized includes one or more of chalcogen elements including oxygen (O) or tellurium (Te), sulfur (S) and selenium (Se), for example. The ion source layer 21 is disposed on the upper electrode 30 side, and in this example, is in contact with the upper electrode 30. The metallic element(s) and the chalcogen element(s) are bonded together, thereby forming a metal chalcogenide layer. This metal chalcogenide layer is mainly in the amorphous structure, and serves as an ion supply source.

As for the metallic element that is possibly cationized, as is reduced on the cathode electrode during the operation of writing and forms a conductive path (filament) in the form of metal, any element chemically stable is preferable, i.e., remaining in the form of metal in the ion source layer 21 containing the chalcogen element(s) described above. Such a metallic element includes, other than those described above, transition metals of groups 4A, 5A, and 6A in the periodic table, i.e., Ti, zirconium (Zr), hafnium (Hf), vanadium (V), niobium (Nb), Ta, Cr, Mo, and W, for example. Among these elements, one or two or more are possibly used. Alternatively, Si or others may be used as additive elements to the ion source layer 21.

Moreover, using any metallic element (M) that is more likely to react with the chalcogen element such as Te in the resistance change layer 22 that will be described later, the ion source layer 21 may be in the layered structure of Chalcogen Element/Ion Source Layer (containing the metallic element M). If this is the configuration, with a heat treatment after the film formation, the resulting structure is stabilized as MTe/Ion Source Layer 21. The material more likely to react with the chalcogen element is exemplified by Al, magnesium (Mg), and others.

The specific material of the ion source layer 21 as such contains ZrTeAl, TiTeAl, CrTeAl, WTeAl, TaTeAl, and others. Such specific materials may also include CuZrTeAl being a result of addition of Cu to ZrTeAl, CuZrTeAlGe being a result of addition of Ge to CuZrTeAl, and CuZrTeAlSiGe being a result of addition of another additive element to CuZrTeAlGe. Another option is ZrTeMg including Mg as an alternative to Al. As for the ionizing metallic element, any similar additive element is possibly used even if a transition metallic element selected for use is not Zr but Ti or Ta, e.g., TaTeAlGe. Moreover, as for the ion conductive material, Te is surely not restrictive, and sulfur (S), selenium (Se), or iodine (I) may be also used, i.e., specifically ZrSAl, ZrSeAl, ZrIAl, CuGeTeAl, and others. Note that exemplified herein is the compound including Te, but this is surely not restrictive, and the compound may also contain any chalcogen element other than Te. Furthermore, Al is not necessarily contained, and CuGeTeZr or others may be also used.

Note that the ion source layer 21 may be added with any other elements for the purpose of preventing peeling of film during a high-temperature heat treatment for the memory layer 20, for example. Silicon (Si) is an exemplary additive element that possibly offers also the improvement of retention characteristics, and is preferably added to the ion source layer 21 together with Zr. Herein, if the content of Si for addition is not enough, the effect of preventing the film peeling is not sufficiently produced, and if the content thereof is too much, the resulting memory operation characteristics are not satisfactory enough. In consideration thereof, the content of Si in the ion source layer 21 is preferably in the range of about 10 to 45 atomic %.

The resistance change layer 22 is positioned on the lower electrode 10 side, and in this example, is in contact with the lower electrode 10. This resistance change layer 22 serves as a barrier against electric conduction, and when a predetermined level of voltage is applied between the lower and upper electrodes 10 and 30, the resistance value thereof shows a change. In this embodiment, this resistance change layer 22 is made of a compound mainly containing a metallic element that is to be converted into trivalent cations such as aluminum (Al) or gadolinium (Gd), and a chalcogen element such as Te behaving as anionic components. The compound as such includes AlTe, MgTe, ZnTe, and others. As for the composition of the compound containing Te as such, with AlTe, for example, the content of Al is preferably in the range from 20 to 60 atomic % inclusive due to the reasons that will be described later. Moreover, the resistance change layer 22 preferably has the initial resistance value of 1 MΩ or larger. Considering as such, the resistance value in the state of low resistance is preferably several hundred kΩ or smaller. For reading at a high speed the state of resistance of any microfabricated resistance change memory, the resistance value in the state of low resistance is preferably as low as possible. However, since the resistance value is 40 to 100 kΩ when writing is performed with the requirements of 20 to 50 μA and 2 V, the memory is supposed to have the initial resistance value higher than that value. Allowing for the one-digit width of resistance separation, the resistance value described above is considered appropriate. Note here that the resistance change layer 22 may be made not only of the above-described material containing Te but also of any previously-used oxide such as GaOx and AlOx.

In the embodiment, the resistance change layer 22 includes a p- or n-type dopant in addition to the compounds described above. To be specific, as for the energy band gap of the resistance change layer 22, when the localized level thereof at the time of erasing shows the distribution like a p-type semiconductor or the distribution on the lower-energy side from the center of a forbidden band, introduced to the resistance change layer 22 is an n-type dopant with activation energy sufficiently larger than 300 K. On the other hand, when the localized level of the energy band gap of the resistance change layer 22 at the time of erasing shows the distribution like an n-type semiconductor or the distribution on the higher-energy side from the center of the forbidden band, introduced to the resistance change layer 22 is a p-type dopant with the activation energy sufficiently larger than 300 K. Herein, the energy of 300 K is the level under the assumption of room temperature, but is surely not restrictive.

The n-type dopant material includes a tetravalent impurity element for substitution of cation atoms, specifically carbon (C), Si, Ge, tin (Sn), Ti, Zr, Hf, and others. The p-type dopant material includes a divalent impurity element for substitution of cation atoms, specifically beryllium (Be), magnesium (Mg), calcium (Ca), strontium (Sr), zinc (Zn), cadmium (Cd), and others. For substitution of anion atoms, a pentavalent impurity element is possibly used, specifically nitrogen (N), phosphorus (P), arsenic (As), antimony (Sb), V, Nb, Ta, and others. Such n- or p-type dopant preferably has the concentration about the same as that of any remaining mobile atoms in the resistance change layer 22. Usually, the resistance value in the high-resistance state causing a disadvantage in terms of resistance separation in the state of writing (low-resistance state) and the state of erasing (high-resistance state) is generally about 100 kΩ to 1 MΩ. The resistivity of the material of the high-resistance layer in this state is estimated as being about 10 to 100 Ωcm. In an example with Si crystal, the impurity concentration leading to such a resistivity is $10^{13}$ cm$^{-3}$ or higher but is $10^{16}$ cm$^{-3}$ or lower. Note that, since the resistance change layer 22 is amorphous in structure, considering that the mobility is to be reduced by generally about three to four orders of magnitude, specifically, the impurity concentration is preferably $10^{16}$ cm$^{-3}$ or higher but is $10^{20}$ cm$^{-3}$ or lower.

Moreover, the resistance change layer 22 preferably has the initial resistance value of 1 MΩ or larger. Considering as such, the resistance value in the state of low resistance is preferably several hundred kΩ or smaller. For reading at a high speed the state of resistance of any microfabricated resistance change memory, the resistance value in the state of low resistance is preferably as low as possible. However, since the resistance value is 40 to 100 kΩ when writing is performed with the requirements of 20 to 50 μA and 2 V, the memory is supposed to have the initial resistance value higher than that value. Allowing for the one-digit width of resistance separation, the resistance value described above is considered appropriate.

The upper electrode 30 may be made of a material similar to that of the lower electrode 10, i.e., a well-known material for use of semiconductor wiring, and preferably, be made of a stable material not reacting with the ion source layer 21 even after post-annealing.

In such a memory element 1 of the embodiment, when a voltage or current pulse is applied by a power supply circuit (pulse application section; not shown) via the lower and upper electrodes 10 and 30, the memory layer 20 shows a change of the electrical characteristics, e.g., change of the resistance value, thereby performing information writing, erasing, and reading. In the below, such an operation is described specifically.

First of all, a positive voltage is applied to the memory element 1 such that the upper electrode 30 is at a positive potential, and the lower electrode 10 side is at a negative potential, for example. In response thereto, any metallic element in the ion source layer 21 is ionized and diffused to the resistance change layer 22, and then is deposited by bonding with electrons on the lower electrode 10 side. As a result, a conductive path (filament) is formed on the interface between the lower electrode 10 and the memory layer 20. This conductive path is made of a low-resistance metallic element reduced in the form of metal. Alternatively, the ionized metallic element remains in the resistance change layer 22, and forms an impurity level. This accordingly decreases the resistance value of the memory layer 20, i.e., the memory layer 20 shows a decrease of resistance value to be lower (to be in the low-resistance state) than that in the initial state (in the high-resistance state).

Thereafter, even if the memory element 1 becomes free of voltage by stopping the application of the positive voltage, the state of low resistance is retained. This means information writing is done. For use in a once-writable memory device, i.e., a so-called PROM (Programmable Read Only Memory), the memory element 1 is completed with recording only by the process of recording described above. On the other hand, for application use in an erasable memory device, i.e., RAM (Random Access Memory), EEPROM (Electronically Erasable and Programmable Read Only Memory), or others, a process of erasing is necessary. During the process of erasing, a negative voltage is applied to the memory element 1 such that the upper electrode 30 is at a negative potential, and the lower electrode 10 side is at a positive potential, for example. In response thereto, in the conductive path formed inside of the memory layer 20, the metallic element is ionized, and then is dissolved into the ion source layer 21 or is bonded with Te or others, thereby forming a compound such as $Cu_2Te$ or CuTe. As a result, the conductive path made of the metallic element disappears or is decreased in area, and the resistance value thus shows an increase.

Thereafter, even if the memory element 1 becomes free of voltage by stopping the application of the negative voltage, the resistance value therein remains high. This allows erasing of any written information. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

For demodulation of any recorded data, the larger ratio is more preferable between an initial resistance value and an after-recording resistance value. However, a too large resistance value of the resistance change layer 22 causes a difficulty in writing, i.e., in decreasing the resistance. As a result, since a threshold voltage for writing is increased too much, the initial resistance value is adjusted to be 1 GΩ or smaller. The resistance value of the resistance change layer 22 is possibly controlled by the thickness thereof or the content of anions therein, for example.

Due to the reasons as such, when the resistance change layer 22 is made of a chalcogen element, Te is a preferable selection for use. This is because, during the decrease of resistance, the metallic element diffused from the ion source layer 21 is stabilized in the resistance change layer 22 so that the resulting low-resistance state becomes easy to retain. Moreover, compared with oxides high in electronegativity and silicon compounds being covalent compounds, the binding force of Te with the metallic element is weaker, and thus the metallic element diffused inside of the resistance change layer 22 is easily moved to the ion source layer 21 by the application of an erasing voltage so that the erasing characteristics are improved. Note that, as for the electronegativity of the chalcogenide compounds, since the absolute values of the chalcogen elements are in the ascending order of tellurium<selenium<sulfur<oxygen, the effect of improvement is to be high with the lower content of oxygen in the resistance change layer 22, and with the use of any chalcogenide low in electronegativity.

Moreover, in the embodiment, as described above, the ion source layer 21 preferably contains Zr, Al, Ge, and others. In the below, the reasons are described.

When the ion source layer 21 contains Zr, this Zr acts as an ionizing element together with the metallic element such as Cu described above so that the resulting conductive path is a mixture of Zr and the above-described metallic element such as Cu. Herein, Zr seems to be reduced on the cathode electrode during the operation of writing, and seems to form a filament in the form of metal in the state of low resistance after the writing. The metal filament as a result of reduction of Zr is relatively difficult to dissolve in the ion source layer 21 containing the chalcogenide element(s) such as S, Se, and Te. Therefore, once the state is put in writing, i.e., in the low-resistance state, the resulting low-resistance state is retained more easily than in the case with a conductive path containing only the above-described metallic element such as Cu. For example, Cu is formed as a metal filament by the operation of writing. However, Cu in the form of metal is dissolved easily in the ion source layer 21 containing the chalcogenide element(s), and in the state of no application of a voltage pulse for writing, i.e., in the state of data retention, Cu is ionized again and the state is changed to high resistance. The resulting characteristics of data retention are not thus satisfactory. On the other hand, combining Zr with any appropriate content of Cu facilitates amorphization, and keeps uniform the microstructure of the ion source layer 21, thereby contributing to the improvement of the characteristics of resistance value retention.

Also for retention of the state of high resistance at the time of erasing, when the ion source layer 21 contains Zr, a conductive path to be formed includes Zr, for example, and when Zr is dissolved in the ion source layer 21 again as ions, due to the lower ion mobility of Zr at least than Cu, the Zr ions are resistant to move even if the temperature is increased, or even if they are left as they are for a long time. As such, Zr in the form of metal is not easily deposited on the cathode electrode, and thus remains high in resistance even if it is kept in the temperature higher than the room temperature or if it is left as it is for a long time.

Moreover, when the ion source layer 21 contains Al, if the upper electrode is biased to a negative potential as a result of the erasing operation, the state of high resistance (erasing state) is stabilized by forming an oxide film stable on the interface between the ion source layer 21 behaving like a solid-electrolyte layer and the anode electrode. This also contributes to the increase of repetition frequency considering the self-reproduction of the resistance change layer. Herein, Al is surely not the only option, and Ge or others acting similar thereto may be also used.

As such, when the ion source layer 21 contains Zr, Al, Ge, and others, compared with the previous memory element, the resulting memory element has the improved characteristics of wide-range resistance value retention and of high-speed operation of writing and erasing, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state is possibly created also through adjustment of the amount of atoms for deposition by changing a write current during a change of resistance from high to low.

Such various characteristics important for the operation of memory, i.e., the characteristics of operation of writing and erasing with voltage application, the characteristics of resistance value retention, and the repetition frequency of operation, vary depending on the addition content of Zr, Cu, and Al, and also Ge.

If the content of Zr is too much, for example, the resulting ion source layer 21 is decreased too much in resistance value, thereby failing in voltage application effectively to the ion source layer 21, or resulting in a difficulty in dissolving Zr in the chalcogenide layer. This especially causes a difficulty in erasing, and the threshold voltage for erasing is increased based on the addition content of Zr. If the content of Zr is all too much, this results in a difficulty also in writing, i.e., decrease of resistance. On the other hand, if the addition content of Zr is too little, the effect of improving the characteristics of wide-range resistance value retention as described above is impaired. In consideration thereof, the content of Zr in the ion source layer 21 is preferably 7.5 or more, and more preferably, 26 atomic % or less.

Moreover, although adding an appropriate content of Cu to the ion source layer 21 indeed facilitates amorphization, if the content thereof is too much, Cu in the form of metal degrades the characteristics of writing retention or adversely affects the speed of the writing operation as is not stable enough in the ion source layer 21 containing the chalcogen element(s). Whereas a combination of Zr and Cu produces the effect of making amorphous the ion source layer 21 with ease, and of keeping uniform the microstructure of the ion source layer 21. This accordingly prevents the material components in the ion source layer 21 from becoming not uniform by the repeated operation, thereby increasing the repetition frequency and improving the retention characteristics. When the content of Zr in the ion source layer is enough in the above-described range, the conductive path of metal zirconium (Zr) is supposed to remain as it is even if the conductive path made of Cu is dissolved again into the ion source layer 21, and thus the characteristics of writing retention are not affected. Moreover, as for the preferable addition content of Cu, as long as cations and anions possibly being the results of dissociation and ionization are in the equivalent relationship of the amount of charge, the equivalence ratio of the charge of ions is supposed to fall within a range of {(Highest Valence of Zr Ions× Number of Moles or Atomic %)+(Valence of Cu Ions×Number of Moles or Atomic %)}/(Valence of Chalcogen Ions× Number of Moles or Atomic %)=0.5 to 1.5.

Note here that, virtually, the characteristics of the memory element 1 are dependent on the composition ratio between Zr and the chalcogen element such as Te, for example. Accordingly, the composition ratio between Zr and the chalcogen element preferably falls within the following range.

Composition Ratio of Zr (Atomic %)/Composition Ratio of Chalcogen Element (Atomic %)=0.2 to 0.74

This is not always evident, but because Cu has the degree of dissociation lower than that of Zr, and because the resistance value of the ion source layer 21 is determined by the composition ratio between Zr and the chalcogen element, as long as the composition ratio between Zr and the chalcogen element falls within the above-described range, the resistance value remains suitable. This thus seems because the bias voltage applied to the memory element 1 works effectively to the portion of the resistance change layer 22.

When the value does not fall within the range described above, e.g., when the equivalence ratio is too large, the balance between the cations and anions is lost, and thus among the existing metallic elements, any element not ionizing is increased in amount. Therefore, the conductive path generated by the operation of writing during the operation of erasing may not be eliminated efficiently. Similarly, when the anion element exists too much because the equivalence ratio is too small, the conductive path in the form of metal generated by the operation of writing is not inclined to remain in the form of metal. The characteristics of writing state retention thus seem to be degraded.

When the content of Al is too much, the Al ions become easy to move, thereby creating the state of writing by reduction of the Al ions. Since Al is not stable enough in the form of metal in the chalcogenide solid electrolyte, the characteristics of low-resistance writing state retention are degraded. On the other hand, when the content of Al is too little, the effect of improving the erasing operation itself or the characteristics of high-resistance region retention is impaired, thereby decreasing the repetition frequency. In consideration thereof, the content of Al in the ion source layer 21 is preferably 30 atomic % or more, and more preferably, 50 atomic % or less.

Herein, Ge is not necessarily contained, but when Ge is to be added, the content thereof is preferably 15 atomic % or less considering that too much content of Ge degrades the characteristics of writing retention.

In the below, the manufacturing method of the memory element 1 in the embodiment is described.

First of all, on a substrate formed with a CMOS circuit such as selection transistor, the lower electrode 10 made of TiN or others is formed. Thereafter, if necessary, any oxides or others on the surface of the lower electrode 10 are removed by reverse sputtering, for example. Next, the formation of layers is performed up to the upper electrode 30 including the resistance change layer 22 and the ion source layer 21 in succession through exchange of targets in a device for sputtering. The targets herein are those each with the composition adapted for the material of the corresponding layer. The diameter of the electrode is 50 to 300 nmϕ. A film of alloy is formed at the same time using a target of a component element. Herein, the technique for doping the n- or p-type dopant to the resistance change layer 22 may possibly include ion implantation being popular as a semiconductor process or diffusion from the interface of the resistance change layer 22, for example.

After the formation of layers up to the upper electrode 30, a wiring layer (not shown) is formed for connection to the upper electrode 30, and a contact section is connected to achieve a common potential among all of the memory elements 1. Thereafter, the layered film is subjected to a post-annealing process. As such, the memory element 1 of FIG. 1 is completed. In the below, the effects by the memory element 1 are described.

In a resistance change memory element, a memory layer configured by a resistance change layer and an ion source layer is disposed between upper and lower electrodes. With such a memory element, as described above, a voltage is so applied that the upper electrode is at a positive potential and the lower electrode is at a negative potential. This ionizes mobile atoms in the ion source layer, and the ionized mobile atoms are then moved into the resistance change layer, whereby a conductive path is formed. This accordingly decreases the resistance value of the resistance change layer so that writing is performed. Next, to each of the upper and lower electrodes, applied this time is a voltage whose polarity is opposite to that applied thereto for writing. In response thereto, the metallic element in the conductive path formed inside of the resistance change layer is ionized again, and then is moved onto the interface between the resistance change layer and the ion source layer so that the conductive path disappears. This accordingly increases the resistance value of the resistance change layer so that erasing is performed.

With the resistance change memory element as such, the resistance value is controlled by the distribution of mobile atoms inside of the resistance change layer, thereby performing writing (ON) and erasing (OFF) of data. Therefore, the ON/OFF ratio being high is important. In order to have the ON/OFF ratio being stably high, desirably, a large number of mobile atoms are introduced into the resistance change layer by an external electric field during writing (in the state of low resistance), and during erasing (in the state of high resistance), the mobile atoms introduced as such into the resistance change layer are entirely moved to the ion source layer side to completely erase the electric conductive channel, i.e., conductive path.

Figure 4:
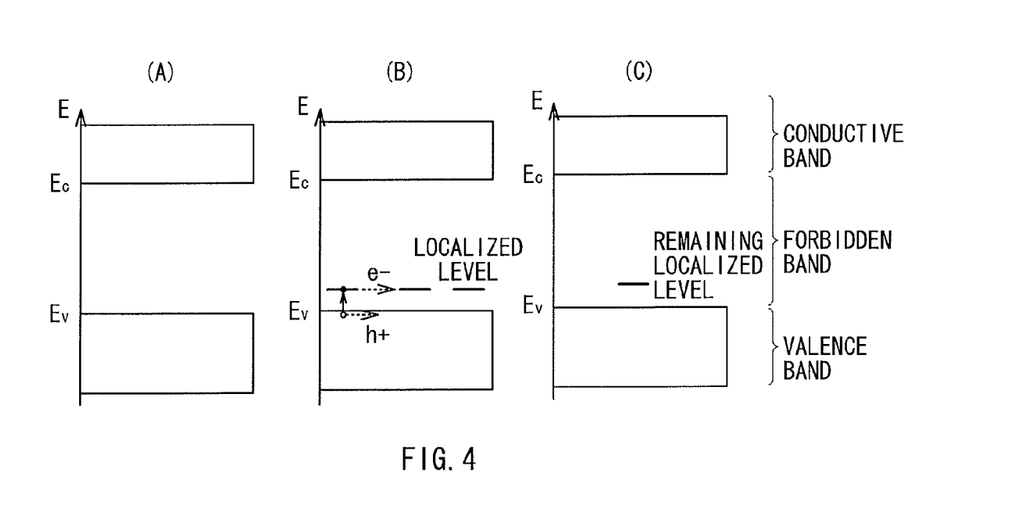
FIGS. 4A to 4C are each a schematic diagram showing a change of energy band in a resistance change layer of a memory element in a comparative example.

FIGS. 4A to 4C are energy band diagrams illustrating any resistance value change in a resistance change layer in various states, i.e., FIG. 4A shows the initial state, FIG. 4B shows the writing state, and FIG. 4C shows the erasing state. The resistance change layer is the one in a resistance change memory element of a comparative example, i.e., is in the previous configuration. FIG. 4A shows the state with completely no mobile atoms. When a write voltage is applied, the state of FIG. 4A shows a change to the state of FIG. 4B, i.e., a localized level is formed in the energy band gap of the resistance change layer, which is resulted from the mobile atoms or others moved from the ion source layer. Like hopping conduction of carriers between the localized levels or like an acceptor in an impurity semiconductor, by the band-like conduction as a result of the localized levels or others formed as such, the resistance change layer is reduced in resistance value. Next, with application of an erasing voltage, the mobile atoms inside of the resistance change layer are moved back to the ion source layer side so that the localized level as a result of the mobile atoms is reduced. Herein, since completely moving back the mobile ions to the ion source layer side is difficult, as shown in FIG. 4C, due to the remaining localized level inside of the resistance change layer, and the resistance change layer in the state of erasing is reduced in resistance value. This thus causes a disadvantage of reducing the capabilities of the memory element because the resistance value at the time of erasing becomes unstable as such.

Figure 5:
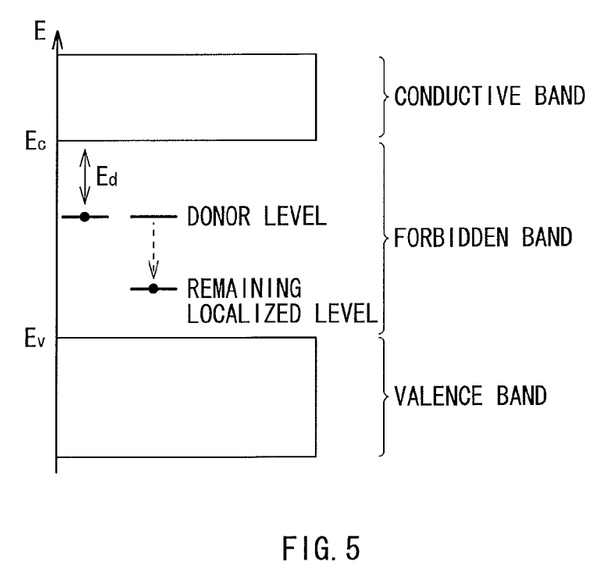
FIG. 5 is a schematic diagram showing an exemplary energy band in the resistance change layer in the memory element of FIG. 1.
Figure 6:
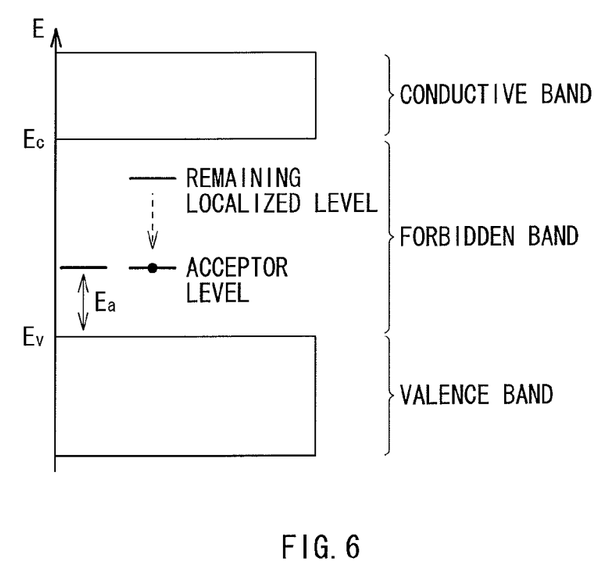
FIG. 6 is a schematic diagram showing another exemplary energy band in the resistance change layer in the memory element of FIG. 1.

On the other hand, with the memory element 1 in the embodiment, the remaining localized level distribution formed in the resistance change layer 22 is used as a basis to determine which of n- and p-type dopants is to be introduced into the resistance change layer 22. To be specific, as shown in FIG. 5, when the remaining localized level inside of the resistance change layer in the state of erasing shows the distribution like a p-type semiconductor, or when the distribution is on the lower-energy side from the center of a forbidden band, the n-type dopant is introduced. Moreover, as shown in FIG. 6, when the remaining localized level inside of the resistance change layer in the state of erasing shows the distribution like an n-type semiconductor, or when the distribution is on the higher-energy side from the center of a forbidden band, the p-type dopant is introduced. As such, even if the localized level remains in the resistance change layer 22, the localized level is deactivated by the movement of electrons from the dopant to the impurity level, thereby preventing the generation of electron carriers to the conductive band. Accordingly, the resistance change layer 22 is stabilized in state of erasing, i.e., in the state of high resistance.

Figure 7:
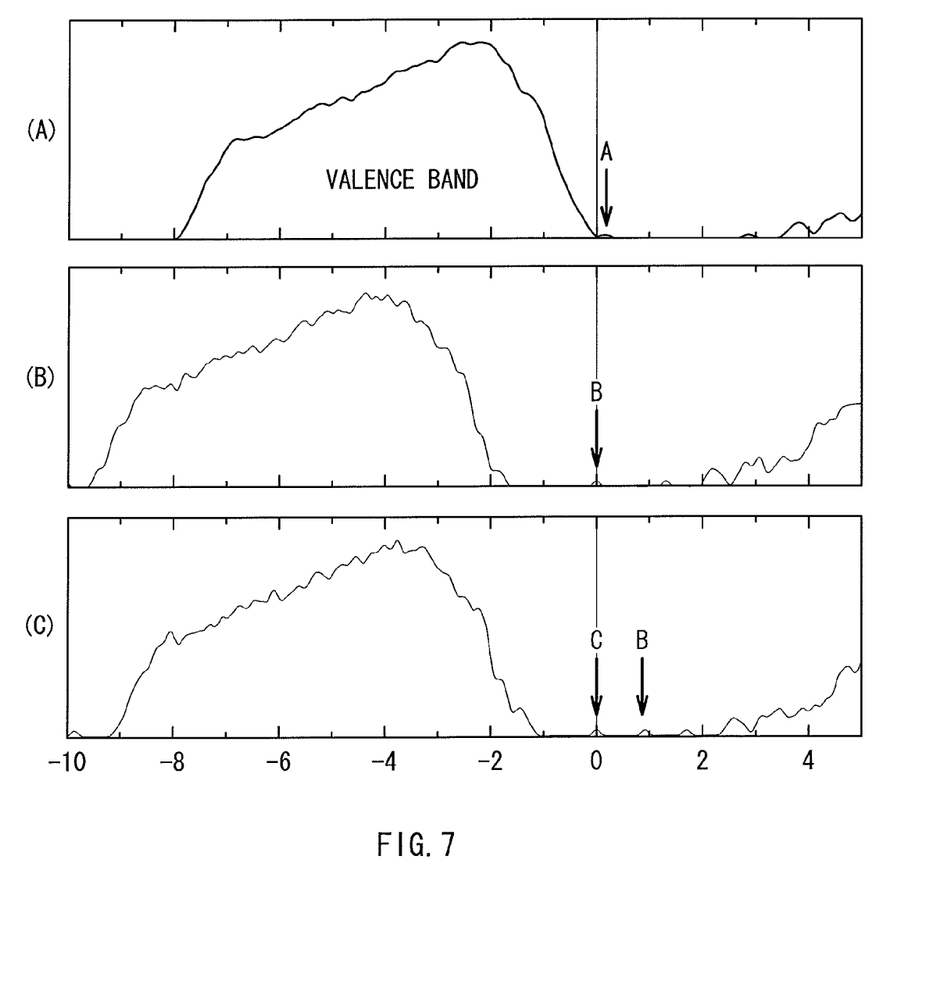
FIGS. 7A to 7C are characteristics diagrams of the electron-state density distribution of the memory element in the comparative example and that of the memory element of FIG. 1.

FIGS. 7A to 7C are diagrams showing the analysis result of the electron-state density distribution of a memory element in a comparative example, and that of the memory element 1 of the embodiment. The analysis is performed by the first principles calculations. The material of the resistance change layer is alumina ($Al_2O_3$), and the mobile atoms are Cu atoms. The energy 0 eV of the lateral axis is at the Fermi level. FIG. 7A shows the electron-state density distribution in a memory element as a comparative example, i.e., with no introduction of a dopant thereto. In the state of erasing, due to the remaining mobile atoms in the resistance change layer, the localized level resulted from the remaining atoms appears in the vicinity of the upper end of a valence band, i.e., arrow A. This localized level acts like an acceptor, thereby causing the state of erasing to be unstable. FIG. 7B shows the electron-state density distribution when C atoms are introduced as an n-type dopant to the resistance change layer 22. It is known that, through introduction of an n-type dopant, the Fermi level is increased (arrow B), and the activation energy of the n-type dopant is sufficiently large, i.e., about a level that the deteriorated state of erasing as a result of the generation of electron carriers to the conductor is negligible. FIG. 7C shows the electron-state density distribution when mobile atoms are remained in the resistance change layer 22 of the memory element of FIG. 7B, i.e., the distribution in the state after erasing. As for the localized level of the mobile atoms, the activation energy is increased by reception of electrons from the n-type dopant, i.e., the localized level is moved from the position shown in FIG. 7A (arrow A) to the position (arrow C). In other words, through introduction of an n-type dopant, the localized sites are known to be deactivated.

As described above, with the memory element 1 in the embodiment, an n- or p-type dopant is introduced to the resistance change layer. This deactivates localized sites inside of the resistance change layer, being a cause of making unstable a resistance-change memory element in the state of erasing, and accordingly stabilizes the resistance value of the resistance change layer in the state of erasing. As a result, the acceptable amount of localized sites is increased for formation at the time of erasing, and the number of manufacture-failed elements is to be decreased. What is more, the failure rate is possibly reduced for chips each including a plurality of memory elements, and the capacity increase is also possibly achieved.

(Memory Device)

By arranging a plurality of memory elements 1 described above in rows or in a matrix, for example, a memory device (memory) is possibly configured. At this time, as appropriate, the memory elements 1 may be each connected with a MOS transistor for element selection use or with a diode to configure a memory cell. The resulting memory cells may be then each connected to a sense amplifier, an address decoder, circuits of writing, erasing, and reading, and others by wiring.

Figure 2:
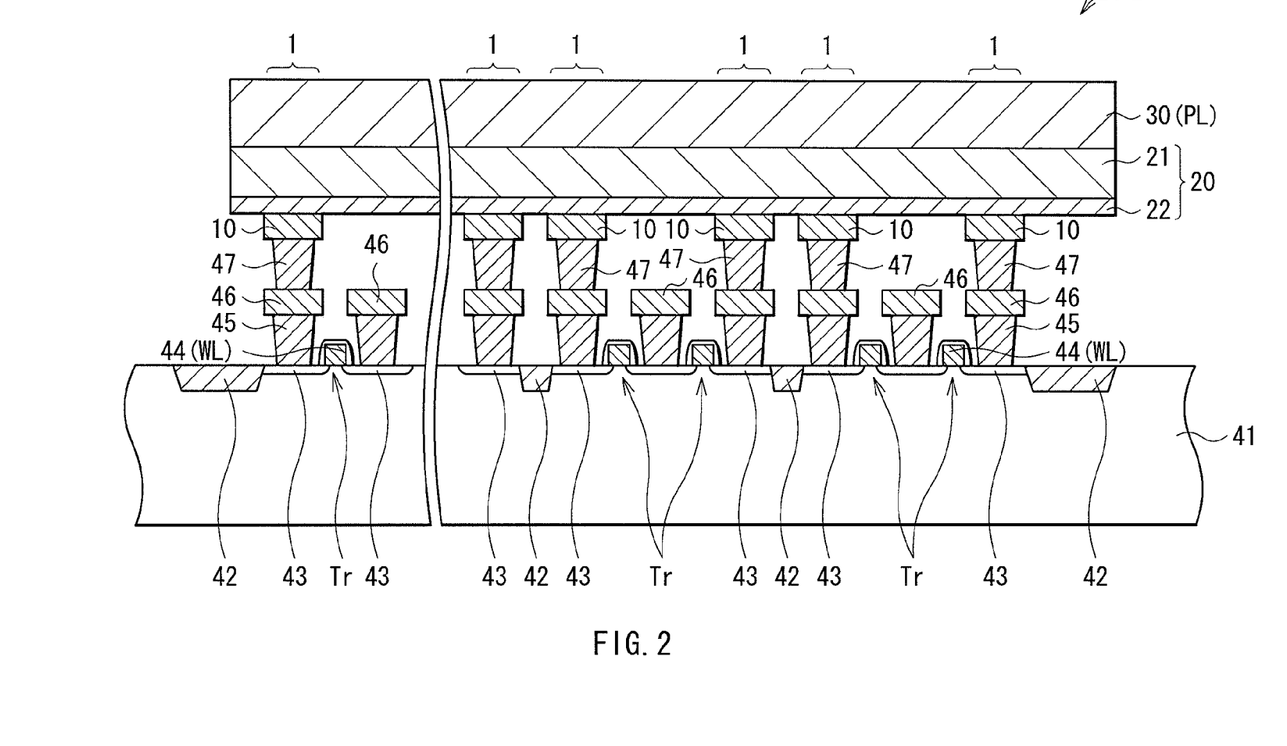
FIG. 2 is a cross-sectional view of a memory cell array using the memory element of FIG. 1, showing the configuration thereof.
Figure 3:
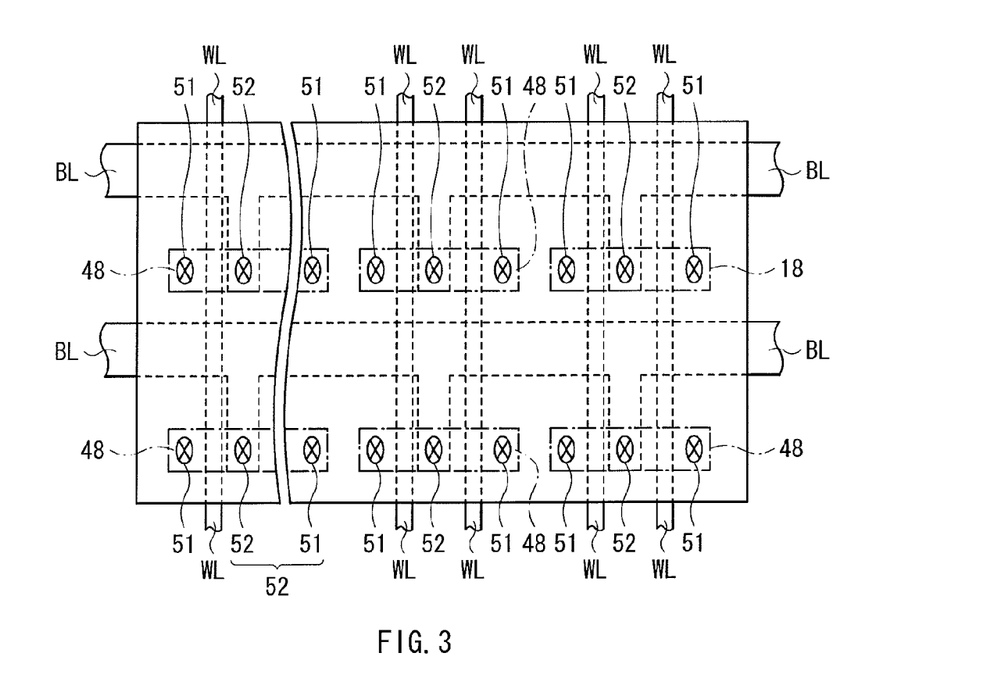
FIG. 3 is a plan view of the memory cell array of FIG. 2.

FIGS. 2 and 3 each show an exemplary memory device (memory cell array) including a plurality of memory elements 1 arranged in a matrix. FIG. 2 shows the cross-sectional configuration of the memory cell array, and FIG. 3 shows the configuration thereof in a planar view. In this memory cell array, to each of the memory elements 1, wiring for connection to the lower electrode 10 side thereof is so provided as to intersect wiring for connection to the upper electrode 30 side thereof, and near the respective intersection points, the memory element 1 is disposed.

The memory elements 1 all share the layers, i.e., the resistance change layer 22, the ion source layer 21, and the upper electrode 30. In other words, these layers, i.e., the resistance change layer 22, the ion source layer 21, and the upper electrode 30, are each for the shared use by all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that the memory cells are electrically separated from one another. As such, the memory elements 1 in the memory cells are each defined by position to correspond to its lower electrode 10. The lower electrodes 10 are each connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. The gate electrode 44 is formed, on the wall surface, with a side wall insulation layer. The gate electrode 44 serves also as a word line WL, which is one of two pieces of address wiring for the memory element 1. One of the source/drain regions 43 of the MOS transistor Tr is electrically connected to the lower electrode 10 of the memory element 1 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 3), which is the remaining piece of address wiring for the memory element 1. Note that, in FIG. 3, an active region 48 of the MOS transistor Tr is indicated by alternate long and short dashed lines. In the active region 48, contact sections 51 are connected to the lower electrode 10 of the memory element 1, and a contact section 52 is connected to the bit line BL.

In such a memory cell array, when a voltage is applied to the bit lines BL with the gate of the MOS transistor Tr turned ON by the word line WL, the voltage is directed to the lower electrode 10 of the selected memory cell via the source/drain of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance as described above, whereby the selected memory cell is written with information. Next, when the potential of the voltage applied this time to the lower electrode 10 is positive compared with the potential of the upper electrode 30 (the plate electrode PL), the resistance value of the memory element 1 is changed in state again to high resistance, whereby the information written to the selected memory cell is erased. For reading of the written information, for example, a selection of memory cell is made by the MOS transistor Tr, and with respect to the selected memory cell, a predetermined level of voltage or current is applied. The current or voltage varying in level based on the resistance state of the memory element 1 at this time is detected via a sense amplifier or others connected to the tip of the bit line BL or of the plate electrode PL. Herein, the voltage or current for application to the selected memory cell is set to be smaller than the threshold value of the voltage or others at which the memory element 1 shows a change of resistance value.

The memory device of this embodiment is applicable to various types of memory devices as described above. For example, the memory device is applicable for use with any types of memories such as once-writable PROM, electrically erasable EEPROM, or so-called RAM available for high-speed writing, erasing, and reproduction.

While the present disclosure has been described in detail, the foregoing description is in all aspects illustrative and not restrictive. It is understood that numerous other modifications and variations are to be possibly devised. For example, in the embodiment described above, the configuration of the memory element 1, and that of the memory cell array are specifically described. However, all of the layers are not necessarily provided, or any other layers may be also provided.

Furthermore, for example, the materials of the layers, the film-forming methods and conditions, and others described in the embodiment above are surely not restrictive, and any other materials, or any other film-forming methods will also do. For example, the ion source layer 21 may be each added with any other transition metallic elements, e.g., Ti, Hf, V, Nb, Ta, Cr, Mo, or W as long as the composition ratio described above remains intact. Moreover, other than Cu, Ag, and zinc (Zn), nickel (Ni) or others may be also added.

The present disclosure contains subject matter related to that disclosed in Japanese Priority Patent Application JP 2010-203475 filed in the Japan Patent Office on Sep. 10, 2010, the entire content of which is hereby incorporated by reference.

What is claimed is:

1. A memory element, comprising:
a first electrode, a memory layer, and a second electrode in this order,
wherein,
the memory layer includes:
(a) a resistance change layer including (i) tellurium, sulfur, or selenium, and (ii) an n-type dopant or a p-type dopant, the resistance change layer being disposed on the first electrode, and
(b) an ion source layer in contact with the resistance change layer, the ion source layer having mobile ions that diffuse into the resistance change layer when a first voltage is applied, and
the n-type or the p-type dopant of the resistance change layer has a concentration that is approximately equal to an amount of mobile ions that remains in the resistance change layer after the mobile ions move from the resistance change layer to the ion source layer when a second voltage is applied, the n-type or the p-type dopant and its concentration being effective to deactivate localized sites that occur in the resistance change layer.

2. The memory element according to claim 1, wherein the concentration of the n-type dopant or the p-type dopant is $10^{16}$ cm$^{-3}$ or higher but $10^{20}$ cm$^{-3}$ or lower.

3. The memory element according to claim 1, wherein the resistance change layer exhibits a localized level distribution in an energy band gap like a p-type semiconductor, and includes the n-type dopant.

4. The memory element according to claim 1, wherein the resistance change layer exhibits a localized level distribution in an energy band gap on a lower-energy side from a center of a forbidden band.

5. The memory element according to claim 1, wherein the n-type dopant is a tetravalent impurity element for substitution of cations.

6. The memory element according to claim 5, wherein the tetravalent impurity element is one or more of carbon (C), silicon (Si), germanium (Ge), tin (Sn), titanium (Ti), zirconium (Zr), and hafnium (Hf).

7. The memory element according to claim 1, wherein the resistance change layer shows a localized level distribution in an energy band gap like an n-type semiconductor, and includes the p-type dopant.

8. The memory element according to claim 1, wherein the resistance change layer shows a localized level distribution in an energy band gap on a higher-energy side from a center of a forbidden band.

9. The memory element according to claim 1, wherein the p-type dopant is a divalent impurity element for substitution of cations, or a pentavalent impurity element for substitution of anions.

10. The memory element according to claim 9, wherein the divalent impurity element is one or more of beryllium (Be), magnesium (Mg), calcium (Ca), strontium (Sr), zinc (Zn), and cadmium (Cd).

11. The memory element according to claim 9, wherein the pentabalent impurity element is one or more of nitrogen (N), phosphorus (P), arsenic (As), antimony (Sb), vanadium (V), niobium (Nb), and tantalum (Ta).

12. The memory element according to claim 1, wherein the resistance change layer includes a metallic element that serves as a trivalent cation.

13. The memory element according to claim 1, wherein when one of the first and second voltages is applied, a low-resistance section is formed by migration of mobile ions, and the resistance change layer shows a change of resistance.

14. A memory device, comprising:
a plurality of memory elements, each memory element including a first electrode, a memory layer, and a second electrode in this order; and
a pulse application section applying a voltage or current pulse selectively to the plurality of memory elements,
wherein,
the memory layer of each memory element includes:
(a) a resistance change layer including (i) tellurium, sulfur, or selenium, and (ii) an n-type dopant or a p-type dopant, the resistance change layer being provided on the first electrode, and (b) an ion source layer in contact with the resistance change layer, the ion source layer having mobile ions that diffuse into the resistance change layer when a first voltage is applied, and the n-type or the p-type dopant of the resistance change layer has a concentration that is approximately equal to an amount of mobile ions that remains in the resistance change layer after the mobile ions move from the resistance change layer to the ion source layer when a second voltage is applied, the n-type or the p-type dopant and its concentration being effective to deactivate localized sites that occur in the resistance change layer.

15. The memory device according to claim 14, wherein the resistance change layer exhibits a localized level distribution in an energy band gap like a p-type semiconductor, and includes the n-type dopant.

16. The memory device according to claim 14, wherein the resistance change layer shows a localized level distribution in an energy band gap like an n-type semiconductor, and includes the p-type dopant.

\* \* \* \* \*